(12) United States Patent
Song

(10) Patent No.: US 7,516,389 B2
(45) Date of Patent: Apr. 7, 2009

(54) CONCATENATED ITERATIVE AND ALGEBRAIC CODING

(75) Inventor: Hongwei Song, Boulder, CO (US)

(73) Assignee: Agere Systems Inc., Allentown, PA (US)

( * ) Notice: Subject to any disclaimer, the term of this patent is extended or adjusted under 35 U.S.C. 154(b) by 559 days.

(21) Appl. No.: 10/981,309

(22) Filed: Nov. 4, 2004

(65) Prior Publication Data

US 2006/0107176 A1      May 18, 2006

(51) Int. Cl.
   *H03M 13/00* (2006.01)
(52) U.S. Cl. .......................... 714/755; 360/53
(58) Field of Classification Search ................. 714/755, 714/804
   See application file for complete search history.

(56) References Cited

U.S. PATENT DOCUMENTS

| | | | | |
|---|---|---|---|---|
| 5,392,299 | A * | 2/1995 | Rhines et al. ............. | 714/755 |
| 6,029,264 | A * | 2/2000 | Kobayashi et al. ......... | 714/755 |
| 6,622,277 | B1 * | 9/2003 | Ramanujam et al. ....... | 714/755 |
| 6,757,122 | B1 * | 6/2004 | Kuznetsov et al. ........ | 360/53 |
| 6,956,872 | B1 * | 10/2005 | Djokovic et al. ......... | 714/755 |
| 7,093,188 | B2 * | 8/2006 | Maiuzzo et al. .......... | 714/755 |
| 7,222,286 | B2 * | 5/2007 | Kim ..................... | 714/755 |
| 2002/0194570 | A1 * | 12/2002 | Birru et al. ............ | 714/792 |
| 2003/0043487 | A1 * | 3/2003 | Morita et al. ........... | 360/25 |

OTHER PUBLICATIONS

"Low-Density Parity-Check Codes Based on Finite Geometries: A Rediscovery and New Results," by Yu Kou, et al, IEEE Transactions On Information Theory, vol. 47, No. 7, Nov. 2001,, pp. 2711-2736, XP-002275913.

"Error Control Coding: Fundamentals and Applications,", 1983, Prentice-Hall, Englewood Cliffs, NJ, USA, XP-002361735, pp. 278-279, figure 9.8.

"Concatenated Low Density Parity Check (LDPC) Codes For Magnetic Recording-Channels," Hongwei Song, et al., Digest of Intermag 2003, Program of the 2003 IEEE International Magnetics Conference, Mar. 28, 2003, pp. DT-12, XP010665224, Boston, USA.

(Continued)

*Primary Examiner*—Esaw T Abraham
*Assistant Examiner*—Sam Rizk
(74) *Attorney, Agent, or Firm*—Mendelsohn & Associates, P.C.; Steve Mendelsohn

(57) ABSTRACT

An apparatus for error-correction encoding information includes, in one embodiment, an outer encode that generates algebraically decodable data, the outer encoder operatively coupled to one or more inner encoders that generate iteratively decodable data. The outer encoder is adapted to encode a group of (q–r) original data symbols using r code symbols to produce q outer-encoded symbols, wherein the coding gain of the outer encoder provides for the correction of up to x symbol errors and (r–2x) symbol erasures where r is an integer greater than zero and x is an integer such that $$0 \leq x < \frac{r}{2}.$$

The one or more iterative EC-inner encoders are adapted to inner encode each of the q outer-encoded symbols or combinations of several outer-encoded symbols independently of the others, wherein each symbol is encoded with h additional code bits.

18 Claims, 7 Drawing Sheets

OTHER PUBLICATIONS

"Retry Mode Soft Reed-Solomon Decoding," by Haitao Xia, et al., IEEE Transactions on Magnetics IEEE USA, vol. 38, No. 5, Sep. 2002, pp. 2325-2327, XP-002361832.

"Array Codes As Low-Density Parity-Check Codes," by John L. Fan, Proc. Of $2_{nd}$ International Symposium on Turbo Codes and Related Topics, Sep. 2000, 4 pages, XP-002333685.

"An Interactive Concatenated Turbo Coding System," by Cathy Ye Liu, et al, IEEE Transactions on Vehicular Technology, vol. 51, No. 5, Sep. 2002, pp. 998-1010, XP-002361833.

"Analysis, Design, and Iterative Decoding of Double Serially Concatenated Codes with Interleavers," by Sergio Benedetto, et al, IEEE Journal on Selected Areas In Communications, IEEE Service Center, Piscataway, NJ, US, vol. 16, No. 2, Feb. 1998, pp. 231-244, XP000741777.

* cited by examiner

Table 1

| Scenario | Errors Introduced by Channel? | Valid Codeword Input to Inner Decoders? | Decoded Symbol Corresponds to Transmitted Symbol? | Original Symbol Recovered? |
|---|---|---|---|---|
| 1 | No | Yes | Yes | Yes |
| 2 | Yes | No | Yes | Yes |
| 3 | Yes | No | No | No (Erasure Symbol) |
| 4 | Yes | Yes | No | No (Error Symbol) |
| 5 | Yes | No | No | No (Error Symbol) |

FIG. 2

CONCATENATED ITERATIVE AND ALGEBRAIC CODING

BACKGROUND OF THE INVENTION

1. Field of the Invention

The present invention relates to error-correction (EC) coding and, more specifically, to concatenated error coding and decoding.

2. Description of the Related Art

In digital communication systems, information is communicated from a transmitter to a receiver over a channel that is typically impaired by some amount of noise. Similarly, in digital storage systems (e.g., magnetic, optical, semiconductor, and organic storage systems) impairments to the information can be introduced during transmission to the storage medium, storage on the storage medium, and read-back from the storage medium. The rate at which errors occur, referred to as the bit-error rate (BER), is a very important design criterion for digital communication links and for data storage. The BER is usually defined to be the ratio of the number of bit errors introduced to the total number of bits. Usually the BER must be kept lower than a specified value, which depends on the application. In both communications and storage systems, EC-coding techniques based on the addition of redundancy to the original messages are commonly employed to ensure that the original information is recovered as accurately as possible in the presence of impairments such as noise and inter-symbol interference (ISI). An introduction and overview of EC codes can be found in Bernard Skalar and Fredric J. Harris, "The ABCs of linear block codes," IEEE Signal Processing Magazine, Jul 2004, pp. 14-35, incorporated herein by reference in its entirety.

Generally, EC decoders fall into two major classes: algebraic hard decoders and iterative soft decoders. Hard decoding refers to a process whereby received signals or signal samples read back from a storage medium are decoded directly to digital symbols (e.g., blocks of binary data), whereas soft decoding refers to a process that results in more probabilistic information, such as the probability that a particular sample is a binary zero or a binary one. For example, a typical soft output decoder might use a 4-bit signed binary value to represent each received sample. A value close to +7 is considered to have a high probability of representing a received binary one, whereas a value that is close to −8 is considered to have a high probability of representing a received binary zero. Iterative decoding can improve the decoding accuracy by generating more-reliable bit estimates from previous, less-reliable bit estimates.

Iterative decoders (e.g., turbo decoders, low-density parity-check (LDPC) decoders, and iterative array decoders) have the attractive characteristic of high coding gain. Coding gain is defined as the increase in efficiency that a coded signal provides over an unencoded signal. Expressed in decibels, the coding gain can indicate, for example, a level of transmit power reduction that can be achieved to maintain the same data rate through a channel when a particular code is employed relative to no code. One characteristic of iterative decoders is that there is no closed-form expression for the coding gain of the decoder. An expression is said to be a closed-form expression if it can be expressed analytically in terms of a bounded number of operations. For example, an infinite sum would generally not be considered closed-form. Since there is no closed-form expression for the coding gain of an iterative decoder, the coding gain of these decoders is typically determined by simulation. Unfortunately, when the target BER of an iterative decoder is very low (e.g., $10^{-15}$ or lower), simulation of the decoder is impractical using today's computing systems. So, for example, a particular iterative decoder might be able to be shown by simulation to exhibit significant coding gain for a system whose target BER is $10^{-5}$ but its performance cannot be determined for a target BER of $10^{-15}$. Further, empirical data tends to indicate that, for iterative decoders, performance tends to flatten out at a low BER, raising further concern that iterative decoders may fail to correct all errors in a reasonable number of iterations. More information on array codes and LDPC codes can be found in J. L. Fan, "Array codes as Low-Density Parity Check codes," Proc. 38th Allerton Conference on Communication, Control, and Computing, 955-956, Sep. 2000, incorporated herein by reference in its entirety. More information on turbo codes can be found in B. Skiar, "A Primer on Turbo Code Concepts," pp. 94-102, IEEE Communications Magazine, December 1997, incorporated herein by reference in its entirety.

Algebraic decoders (e.g., Hamming decoders, Reed-Solomon decoders, Bose-Chaudhuri-Hocquenghem (BCH) decoders, and algebraic array decoders), on the other hand, can be less efficient (e.g., lower coding gain) than iterative decoders; however, the performance of algebraic decoders can be calculated analytically at an arbitrarily low target BER. Thus, given a particular target BER, and given an anticipated channel error rate, a closed-form expression can be used to determine whether a particular algebraic code can be used to meet the target BER or not.

For data storage applications, the corrected bit-error rate (i.e., the BER after error correction) is preferably on the order of $10^{-15}$ or smaller. Bit errors can be introduced in data storage applications, for example, because of mistracking of read heads, the fly-height variation of a read head relative to the recording medium, the bit density, and the signal-to-noise ratio (SNR) of the system. Today, the goal of data storage applications is to realize storage densities of one tera-bit per square inch (1 Tbit/in$^2$) and higher. Such a high bit density generates high intersymbol interference (ISI), which complicates the task of realizing low BERs. Further, with such high bit densities, the physical space each bit takes up on the recording medium becomes relatively small, resulting in relatively low signal strength, which affects the SNR. In addition, computationally complex encoding/decoding schemes make the associated decoding operation difficult to implement at high bit rates.

Accordingly, there exists a need for a coding scheme that leads to corrected BERs of $10^{-15}$ or lower despite the complications of large ISI and low SNR that are typically associated high bit densities, such as 1 Tbit/in$^2$. Further, there exists a need for such a coding scheme to permit encoding/decoding at high data rates.

SUMMARY OF THE INVENTION

Problems in the prior art are addressed, in accordance with principles of the present invention, by a method and apparatus for error-correction encoding and decoding that involves the use of concatenated algebraic and iterative decoders. The iterative decoders are used to efficiently reduce errors from high to medium BERs, while the algebraic decoders ensure performance at low BER.

One embodiment of the present invention is a method of EC encoding that involves (1) EC encoding data using an EC outer encoder to produce encoded data that can be decoded using an algebraic EC outer decoder and (2) further EC encoding the encoded data using one or more EC inner encoders to produce further-encoded data that can be decoded using one or more iterative EC inner decoders.

Another embodiment of the present invention is a method of decoding EC-encoded data by applying an iterative EC inner decoder and an algebraic EC outer decoder to the EC-encoded data. The iterative EC inner decoder operates to correct errors in the EC-encoded data as a function of redundant data generated by an EC inner encoder. The algebraic EC outer encoder operates to correct errors in the EC-encoded data by making use of redundant data generated by an EC outer encoder.

Another embodiment of the present invention is a method for decoding EC-encoded data generated by applying an outer encoder followed by at least one inner encoder to original data. The method includes the steps of (a) applying at least one inner decoder to the EC-encoded data to generate first-decoded data, wherein the at least one inner decoder corresponds to the at least one inner encoder, (b) applying at least one iterative decoder to the first-decoded data to generate second-decoded data, wherein the at least one iterative decoder corresponds to the outer encoder; and (c) applying an algebraic decoder to the second-decoded data to generate output decoded data, wherein the algebraic decoder corresponds to the outer encoder.

Another embodiment of the present invention is a concatenated decoder for decoding EC-encoded data generated by applying an outer encoder followed by at least one inner encoder to original data. The decoder includes (a) at least one inner decoder adapted to decode the EC-encoded data to generate first-decoded data, wherein the at least one inner decoder corresponds to the at least one inner encoder, (b) at least one iterative decoder adapted to decode the first-decoded data to generate second-decoded data, wherein the at least one iterative decoder corresponds to the outer encoder; and (c) an algebraic decoder adapted to decode the second-decoded data to generate output decoded data, wherein the algebraic decoder corresponds to the outer encoder.

Another embodiment of the present invention is a concatenated decoder for decoding EC-encoded data generated by (1) applying an outer encoder to a first block of data to generate a first block of symbols and (2) applying at least one inner encoder to the first block of symbols to generate a first block of codewords. The concatenated decoder includes at least one inner decoder adapted to decode a second block of codewords corresponding to the first block of codewords. The decoding of the second block of codewords generates a second block of symbols corresponding to the first block of symbols. The at least one inner decoder independently decodes each codeword in the second block of codewords. At least one these codeword is decoded by the inner decoder to generate two or more symbols in the second block of symbols. The concatenated decoder also includes an algebraic outer decoder adapted to apply an algebraic decoding scheme to the second block of symbols to generate a second block of data corresponding to the first block of data.

BRIEF DESCRIPTION OF THE DRAWINGS

Other aspects, features, and advantages of the present invention will become more fully apparent from the following detailed description, the appended claims, and the accompanying drawings in which:

FIG. 2 includes Table 1, which details scenarios associated with passing a codeword through a channel.

DETAILED DESCRIPTION

Reference herein to "one embodiment" or "an embodiment" means that a particular feature, structure, or characteristic described in connection with the embodiment can be included in at least one implementation of the invention. The appearances of the phrase "in one embodiment" in various places in the specification are not necessarily all referring to the same embodiment, nor are separate or alternative embodiments necessarily mutually exclusive of other embodiments.

Error-Correction System

Figure 1:
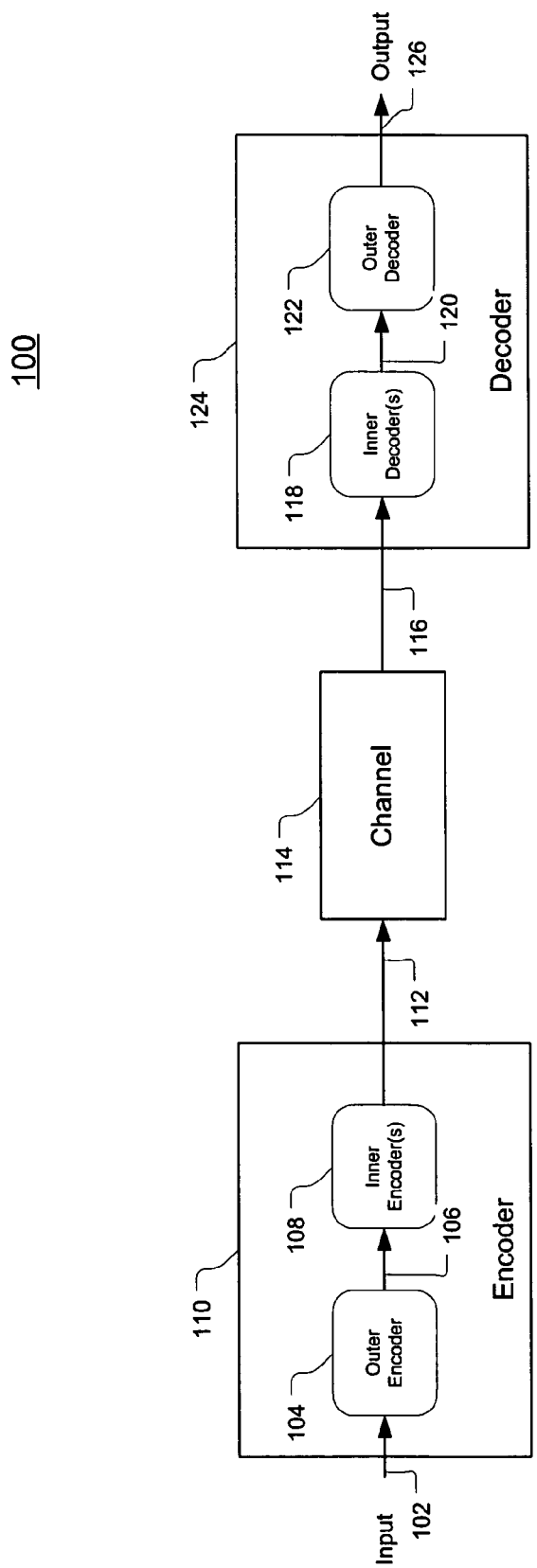
FIG. 1 illustrates an exemplary error-correction system according to the present invention.

FIG. 1 illustrates an exemplary EC system 100 according to the present invention. EC system 100 includes EC encoder 110 and EC decoder 124. EC encoder 110 includes EC outer encoder 104 and one or more EC inner encoders 108. EC decoder 124 includes one or more EC inner decoders 118 and EC outer decoder 122.

In operation, outer encoder 104 encodes input data 102 with redundant data to produce encoded data 106. Encoded data 106 is then passed to a series of one or more inner encoders 108 where additional EC encoding is performed to produce encoded data 112. Encoded data 112 is then passed through channel 114 (e.g., a transmission or storage channel) where errors are invariably introduced into the data. The (potentially errored) encoded data is then received (in the case of a transmission channel) or retrieved (in the case of a storage channel) and the resulting encoded data 116 is then presented to EC decoder 124. In decoder 124, the one or more inner decoders 118 operate to correct some or all of the errors that were introduced by the channel. The output 120 of the inner decoders is passed to outer decoder 122 where some or all of the remaining errors may be corrected. Finally, recovered or partially recovered data 126 is output from decoder 124.

In encoder 110, outer encoder 104 and inner encoder(s) 108 can be a suitable combination of a wide variety of EC encoders as are known in the art (e.g., turbo, two-dimensional product code (2DPC), LDPC, hamming, Reed Solomon, BCH, and array encoders) with the code generated by outer encoder 104 being algebraically decodable.

Similarly, in decoder 124, inner decoder(s) 118 and outer decoder 122 are a suitable combination of EC decoders corresponding to the encoders which make up encoder 110, with outer decoder 122 being at least iteratively decodable. In general, inner decoder(s) 118 may be a series of one or more iterative or algebraic decoders corresponding to inner encoder(s) 108 and possibly outer encoder 104.

Encoding

Figure 3:
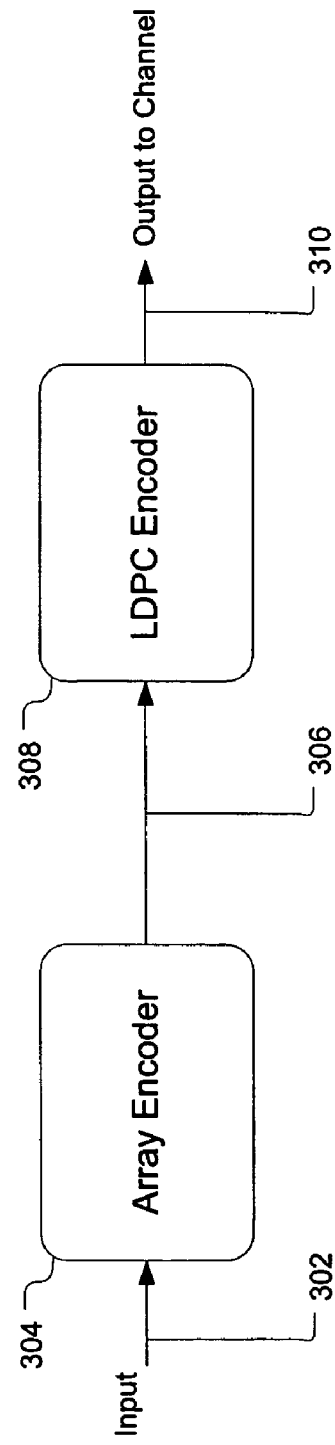
FIG. 3 illustrates exemplary embodiment 300 of encoder 110 of FIG. 1.

FIG. 3 illustrates exemplary embodiment 300 of encoder 110 of FIG. 1, comprising (outer) array encoder 304 operatively coupled to (inner) LDPC encoder 308. In operation, array encoder 304 receives input data 302 to be transmitted or stored, encodes the input data to produce array-encoded data 306, and then passes the array-encoded data to LDPC encoder 308. LDPC encoder 308 then encodes the array-encoded data to produce LDPC/array-encoded data 310.

Figure 4:
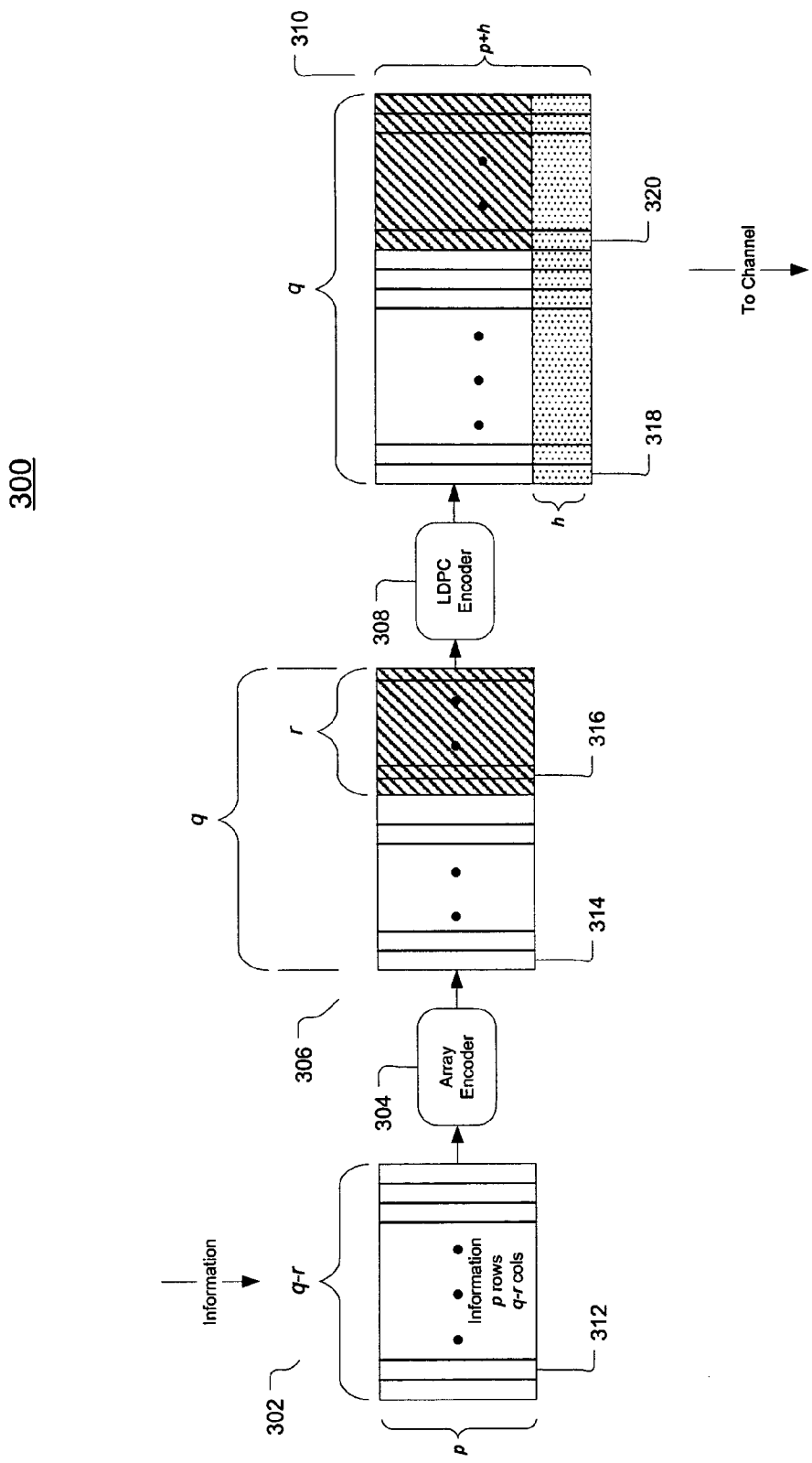
FIG. 4 illustrates additional details associated with the operation of encoder 300 of FIG. 3.

FIG. 4 illustrates additional details associated with the operation of encoder 300 of FIG. 3. Input data to be encoded by encoder 300 is first grouped into p row by (q–r) column blocks 302 where each block entry is a single bit of input data, p, q, and r are positive integers, and 0<r<q. In array-encoder terminology, each of the (q−r) columns is considered to be a symbol. Block 302 can thus be considered a data block with (q−r) data symbols 312. The operation of array encoder 304 results in (p×q) block 306, which includes the original (q−r) symbols 312 as well as r code (in this case, parity) symbols 316. The resulting (p×q) data block 306 is then fed to LDPC encoder 308, where each column is encoded independently of the other columns in block 306. The LDPC encoding results in the addition of h bits of code (in this case, parity) to each column of data block 306 to produce q codewords (e.g., codewords 318 and 320), each of length (p+h). The inner, LDPC encoder can, in various implementations, process each column in series or in parallel as is most appropriate for the implementation. Generally, a parallel-implementation option can speed up the operation of the inner encoder relative to a serial implementation.

In alternative implementations, one or more columns of block 306 can be combined into a single codeword with each combination operated on independently of the others by LDPC encoder 308.

Detection

Figure 5:
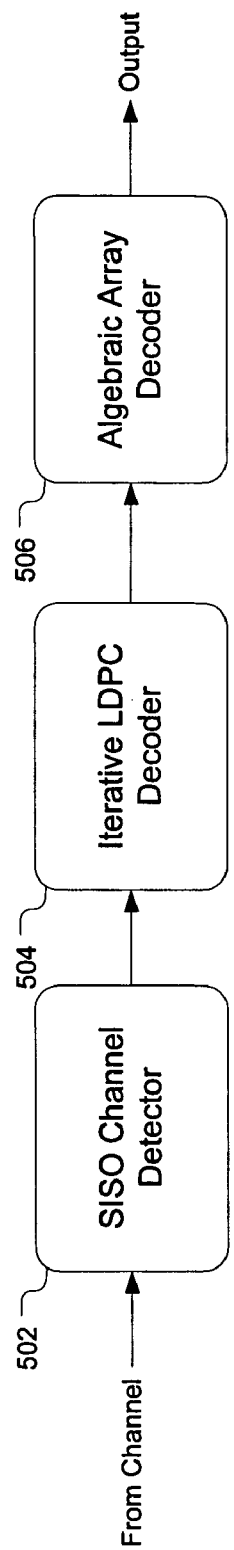
FIG. 5 illustrates exemplary embodiment 500 of decoder 124 of FIG. 1.
Figure 6:
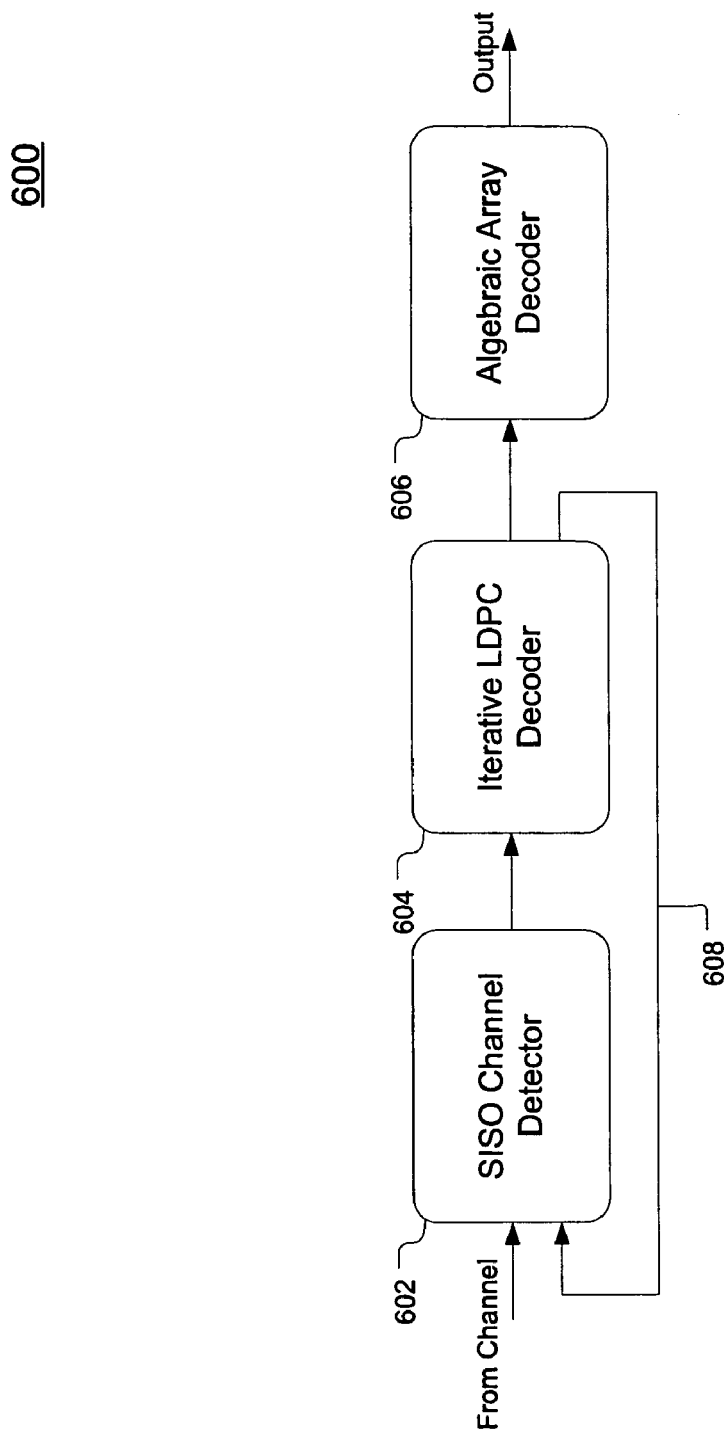
FIG. 6 illustrates alternative exemplary embodiment 600 of decoder 124 of FIG. 1
Figure 7:
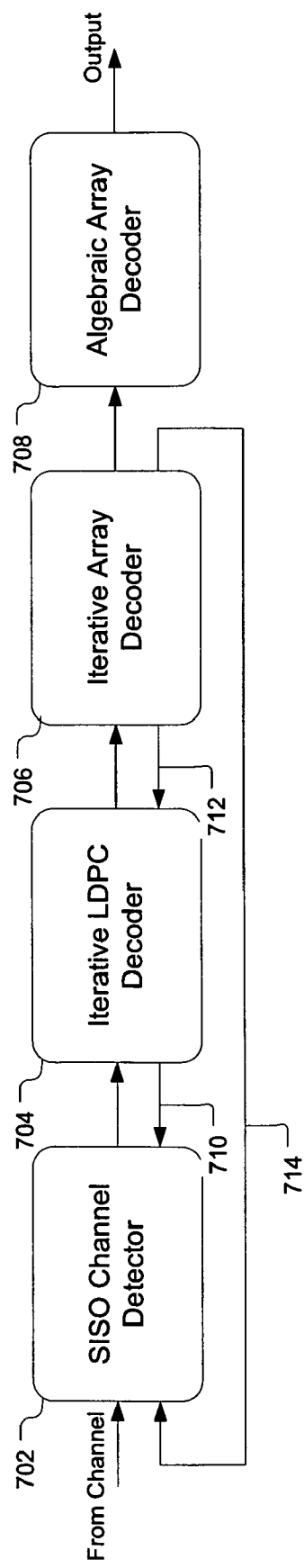
FIG. 7 illustrates another alternative exemplary embodiment 700 of decoder 124 of FIG. 1.

In each embodiment of the decoder illustrated by FIGS. 5, 6, and 7, a soft input, soft output (SISO) channel detector (e.g., SISO channel detector 502 of FIG. 5) receives data from the channel. This data is arranged substantially like data block 310 output from inner encoder 308, but it is potentially corrupted by noise and impairments associated with the channel between the encoder and the decoder. The SISO channel detector processes the data using a SISO algorithm (e.g., a soft output Viterbi algorithm (SOVA)) and outputs a soft estimate for each data bit received. This estimate could be in the form of a six-bit binary value with range −32 to +31. If the value is close to −32, it is considered highly likely that the data bit received was transmitted as a binary zero. If the value is close to +31, it is considered highly likely that the data bit received was transmitted as a binary one. The soft estimates generated by the channel detector are divided into q columns of (p+h) six-bit values corresponding to the q codewords of (p+h) bits that were generated by the encoder, and these q columns of soft data are passed to the first stage of the decoder for processing.

Decoding

In the encoder embodiment of FIG. 3, since array-encoded data can be iteratively and/or algebraically decoded, there are various options for decoder implementation as illustrated in FIGS. 5, 6, and 7.

Note that, when a codeword (e.g., column 318 of FIG. 4) is passed through the channel, processed by a channel detector, and acted upon by one or more inner decoders, there are a number of different possible scenarios that associated with the data that is input to the outer decoder as summarized in Table 1 of FIG. 2. In the first scenario, no errors are introduced by the channel and the received codeword corresponds to the codeword that was transmitted from the encoder to the channel. In the second scenario, one or more errors are introduced into a codeword by the channel but the errors are correctable by the inner decoder(s). In the third scenario, one or more errors are introduced by the channel, which errors exceed the ability of the inner decoder(s) to correct. In this third scenario, the symbol that was encoded (e.g., original data symbol 312 or parity symbol 316 of FIG. 4) is unrecoverable by the inner decoder alone. This unrecoverable symbol is defined as an erasure symbol and its location is flagged to the outer decoder. In the fourth scenario, the nature of errors is such that the original codeword gets mapped to another valid codeword but one that corresponds to a symbol different from the one that was originally encoded. In this case, a data symbol or parity symbol is recovered by the inner decoder(s), but it is not the symbol that was encoded. This type of symbol is known as an error symbol. In the fifth scenario, the nature of errors is such that the original codeword gets mapped to an invalid codeword that corresponds to a different symbol from the original symbol. In this case, the inner decoder(s) decode the invalid codeword to the wrong symbol. As such, this is another example of an error symbol.

The (p×q) block of data that results from the inner decoder(s) operation includes sufficient redundancy to allow correction (during decoding by the outer decoder) of up to x error symbols and (r−2x) erasure symbols, where r is an integer greater then zero (r−2x) is an integer greater than zero, and x is an integer such that $$0 \le x < \frac{r}{2}.$$

So, as an example, if the outer encoder adds seven code symbols to a block of received data symbols (i.e., r=7), then, if there are no symbol errors, the outer decoder will be able to recover from up to seven erasure symbols in that block. If there is one symbol error, then the outer decoder will be able to recover from up to five erasure symbols in that block, if there are two symbol errors, then the outer decoder will be able to recover from up to three erasure symbols in the block, etc. Note that, in this example, if there are more than three symbol errors, then the outer decoder will not be able to recover the original data.

Decoder Embodiments

FIG. 5 illustrates exemplary embodiment 500 of decoder 124 of FIG. 1, which includes SISO channel detector 502, iterative LDPC decoder 504, and algebraic array decoder 506. In operation, channel detector 502 receives EC-encoded data from the channel, produces soft estimates of the data, divides the estimates into blocks of q columns and (p+h) rows, and delivers the estimates to LDPC decoder 504.

The LDPC decoder iteratively decodes each column, independently of the others, and flags a column as an erasure symbol to algebraic array decoder 506 if LDPC decoder 504 fails to converge to a valid codeword after a specified maximum number of iterations.

Note that, the inner, LDPC decoder(s) can, in various implementations, process each column in series or in parallel as is most appropriate for the implementation. Generally, a parallel-implementation option can speed up the operation of the inner decoder(s) relative to a serial implementation.

As discussed earlier, an attempt by the LDPC decoder to recover a symbol from the codeword will result in either (1) an erasure symbol, (2) an error symbol, or (3) the correct original symbol. In the first case, the codeword is flagged by LDPC decoder 504 as an erasure symbol to array decoder 506. In array decoder 506, the erasure is noted and the symbol is discarded. In the latter two cases, the h bits of parity are removed from the codeword, and the resulting symbol is passed to the array decoder for further processing. Assuming zero error symbols, algebraic array decoder 506 can correct up to r erasure symbols, where r is an integer greater than zero. If there are more than r erasure symbols flagged by the inner decoder, then the overall block is flagged as uncorrectable by the array decoder. If there are r or fewer erasure symbols in the data block and no error symbols, or if there are r−2x or fewer erasure symbols in the data block where x is the integer number of error symbols in the block, then the data block is correctable and the original data symbols are recovered by array decoder 506 and passed to the output of decoder 500.

Assuming $f_{inner}$ is the failure rate of the inner LDPC decoder, then the block error rate of the concatenated-algebraic-iterative decoder can be calculated analytically using:

$$BlockER = \sum_{i=0}^{r} \frac{q!(q-i)!}{i!} f_{inner}^{i}(1-f_{inner})^{q-i} \quad (1)$$

In alternative implementations, a codeword generated by LDPC encoder 308 is formed from more than one symbol. In such a case, decoder 504 will decode the codeword to generate the original symbols that were encoded into the codeword. Each codeword can combine a different number of symbols and each codeword can be operated on independently of the others by the LDPC decoder to yield the corresponding number of original symbols, erasure symbols, or error symbols.

Decoding with Extrinsic Information

FIG. 6 illustrates an alternative exemplary embodiment 600 of decoder 124 of FIG. 1 that includes SISO channel detector 602, iterative LDPC decoder 604, and algebraic array decoder 606. In operation, channel detector 602 receives EC-encoded data from the channel, produces soft estimates of the data, divides the estimates into blocks of q columns and (p+h) rows, and delivers the estimates to LDPC decoder 604. The LDPC decoder iteratively decodes each column independently of the others and flags a column as an erasure symbol if the decoder fails to converge to a valid codeword after a specified maximum number of iterations. In the embodiment of FIG. 6, the decision performance of inner decoder 604 is improved by allowing extrinsic-information (e.g., soft estimates) exchange from the inner decoder to channel detector 602. Here, data path 608 is used for the information exchange.

As with the embodiment of FIG. 5, erasure symbols are flagged to the array decoder where the positions of the erasure symbols are noted. For non-erasure symbols, the h parity bits are stripped from each codeword and each non-erasure symbol is passed to the array decoder for further processing. The algebraic array decoder further processes the symbols and, assuming the number of errors is within the coding gain of the overall decoder, the array decoder outputs the original data symbols on the decoder's output at the target BER.

As a result of benefits derived from multiple iterations with extrinsic-data exchange between the LDPC decoder and the SISO channel detector, the failure rate $f_{inner}$ of embodiment 600 should be better (i.e., lower) than the failure rate $f_{inner}$ associated with the embodiment of FIG. 5, resulting in an improved (i.e., lower) block error rate per equation (1).

Concatenated Inner Decoders

FIG. 7 illustrates another alternative exemplary embodiment 700 of decoder 124 of FIG. 1. Embodiment 700 includes SISO channel detector 702, iterative LDPC decoder 704, iterative array decoder 706, and algebraic array decoder 708. In operation, channel detector 702 receives EC-encoded data from the channel, produces soft estimates of the data, divides the estimates into blocks of q columns and (p+h) rows, and delivers the estimates to LDPC decoder 704. The LDPC decoder iteratively decodes each column independently of the others and flags a column as an erasure symbol if the decoder fails to converge to a valid codeword after a specified maximum number of iterations. In this embodiment, as in the embodiment of FIG. 6, the decision performance of inner decoder 704 is improved by allowing extrinsic-information exchange from LDPC decoder 704 to channel detector 702 (via data path 710). However, in this embodiment, taking advantage of the fact that array codes can be both iteratively decoded and algebraically decoded, an extra decoder stage (iterative array decoder stage 706) is added to the decoder. Also, to further improve performance, extrinsic-information exchange is supported between the two iterative decoder stages 704 and 706 (via data path 712) and between the second iterative decoder stage 706 and SISO channel detector 702 (via data path 714).

As with the embodiments of FIGS. 5 and 6, erasure symbols are flagged to the outer decoder, in this case algebraic array decoder 708, where the locations of the erasure symbols are noted. Otherwise, the h parity bits are stripped from each codeword and each non-erasure symbol is passed to the algebraic array decoder 708 for further processing. The algebraic array decoder further processes the symbols and, assuming the number of errors is within the coding gain of the decoder, decoder 708 outputs the original data symbols on the decoder's output.

As a result of benefits from multiple iterations with extrinsic-information exchange between the LDPC decoder, the iterative array decoder, and the SISO channel detector, the failure rate $f_{inner}$ of embodiment 700 should be better (i.e., lower) than the failure rates associated with either the embodiment of FIG. 5 or the embodiment of FIG. 6.

More generally, N iterative decoders and M algebraic decoders may be utilized in various realizations of the present invention where N and M are both integers greater than zero. Note that, in some implementations, the iterative and algebraic decoders may be interleaved, so long as the last decoder is an algebraic decoder.

In various embodiments of the present invention, the inner encoder(s)/decoder(s) can be two-dimensional product encoder(s)/decoder(s).

The concatenated algebraic and iterative coding scheme provides great flexibility in the selection of coding gain versus complexity at a target BER. The decoding can be performed in serial, partial parallel, or full parallel hardware or software. The complexity of the decoder can be lower than a single iterative (e.g., LDPC) decoder of the same code rate because each amount of data that is operated on can be smaller (e.g., a column as opposed to an entire block). Using algebraic decoding for the array code, the block error rate can be calculated analytically down to a relatively low BER (e.g., $10^{-15}$)

The invention can be implemented in either hardware, software, or some combination of hardware and software, including but not limited to: discrete hardware logic, application specific integrated circuit, custom integrated circuits, programmable logic, programmable microprocessor-based systems, or network devices such as framers, routers, line interface units, multiplexors, demultiplexors, and mappers or other multiple-interface devices such as add/drop multiplexors, ATM switches, and other such devices which incorporate multiple interfaces.

While this invention has been described with reference to illustrative embodiments, this description should not be construed in a limiting sense. Various modifications of the described embodiments, as well as other embodiments of the invention, which are apparent to persons skilled in the art to which the invention pertains are deemed to lie within the principle and scope of the invention as expressed in the claims.

Although the steps in the method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. A method for decoding error-correction (EC)-encoded data generated by applying an outer EC encoder followed by at least one inner EC encoder to original data, the method comprising:
   (a) applying at least one inner EC decoder to the EC-encoded data to generate first-decoded data, wherein the at least one inner EC decoder corresponds to the at least one inner EC encoder;
   (b) applying at least one iterative EC decoder to the first-decoded data to generate second-decoded data, wherein the at least one iterative EC decoder corresponds to the outer EC encoder; and
   (c) applying an algebraic EC decoder to the second-decoded data to generate output decoded data, wherein the algebraic EC decoder corresponds to the outer EC encoder.

2. The invention of claim 1, wherein the at least one inner EC decoder comprises an iterative EC decoder.

3. The invention of claim 1, wherein the at least one inner EC decoder comprises a low-density, parity-check (LDPC) decoder, the at least one iterative EC decoder comprises an iterative array decoder, and the algebraic EC decoder is an algebraic array decoder.

4. The invention of claim 1, wherein:
   the EC-encoded data comprises a second block of codewords corresponding to a first block of codewords generated by (1) applying the outer EC encoder to the original data to generate a first block of symbols, and (2) applying the at least one inner EC encoder to the first block of symbols to generate the first block of codewords; and
   step (a) comprises independently decoding each codeword in the EC-encoded data to generate the first-decoded data, wherein:
      the first decoded data comprises a second block of symbols corresponding to the first block of symbols; and
      the decoding of at least one of the codewords by the at least one inner EC decoder generates two or more symbols in the second block of symbols.

5. The invention of claim 1, wherein step (a) further comprises the step of applying a channel detector to receive the EC-encoded data from a channel.

6. The invention of claim 5, wherein at least one of:
   extrinsic information is passed from the at least one inner EC decoder to the channel detector;
   extrinsic information is passed from the at least one iterative EC decoder to the channel detector; and
   extrinsic information is passed from the at least one iterative EC decoder to the at least one inner EC decoder.

7. The invention of claim 1, wherein the algebraic EC decoder is an algebraic array decoder.

8. The invention of claim 1, wherein:
   the outer EC encoder is an outer array encoder that applies array encoding;
   the at least one inner EC encoder comprises at least one inner LDPC encoder that applies LDPC encoding;
   the EC-encoded data was generated by applying the outer array encoder followed by the at least one inner LDPC encoder to the original data;
   the at least one inner EC decoder comprises at least one LDPC decoder that applies LDPC decoding to the EC-encoded data to generate the first-decoded data;
   the at least one iterative EC decoder comprises at least one iterative array decoder that applies array decoding in an iterative manner to the first-decoded data to generate the second-decoded data; and
   the algebraic EC decoder is an algebraic array decoder that applies array decoding in an algebraic manner to the second-decoded data to generate the output decoded data.

9. A concatenated decoder for decoding EC-encoded data generated by applying an outer EC encoder followed by at least one inner EC encoder to original data, the decoder comprising:
   (a) at least one inner EC decoder adapted to decode the EC-encoded data to generate first-decoded data, wherein the at least one inner EC decoder corresponds to the at least one inner EC encoder;
   (b) at least one iterative EC decoder adapted to decode the first-decoded data to generate second-decoded data, wherein the at least one iterative EC decoder corresponds to the outer EC encoder; and
   (c) an algebraic EC decoder adapted to decode the second-decoded data to generate output decoded data, wherein the algebraic EC decoder corresponds to the outer EC encoder.

10. The invention of claim 9, wherein the at least one inner EC decoder comprises an iterative EC decoder.

11. The invention of claim 9, wherein the at least one inner EC decoder comprises an LDPC decoder, the at least one iterative EC decoder comprises an iterative array decoder, and the algebraic EC decoder is an algebraic array decoder.

12. The invention of claim 9, wherein:
   the EC-encoded data comprises a second block of codewords corresponding to a first block of codewords generated by (1) applying the outer EC encoder to the original data to generate a first block of symbols, and (2) applying the at least one inner EC encoder to the first block of symbols to generate the first block of codewords; and
   the at least one inner EC decoder is adapted to independently decode each codeword in the EC-encoded data to generate the first-decoded data, wherein:
   the first decoded data comprises a second block of symbols corresponding to the first block of symbols; and
   the decoding of at least one of the codewords by the at least one inner EC decoder generates two or more symbols in the second block of symbols.

13. The invention of claim 12, further comprising a channel detector adapted to receive the EC-encoded data from a channel.

14. The invention of claim 13, wherein at least one of:
   the at least one inner EC decoder is adapted to pass extrinsic information to the channel detector;
   the at least one iterative EC decoder is adapted to pass extrinsic information to the channel detector; and
   the at least one iterative EC decoder is adapted to pass extrinsic information to the at least one inner EC decoder.

15. The invention of claim 9, wherein the algebraic EC decoder is an algebraic array decoder.

16. The invention of claim 9, wherein:
   the outer EC encoder is an outer array encoder that applies array encoding;
   the at least one inner EC encoder comprises at least one inner LDPC encoder that applies LDPC encoding;
   the EC-encoded data was generated by applying the outer array encoder followed by the at least one inner LDPC encoder to the original data;

the at least one inner EC decoder comprises at least one LDPC decoder that applies LDPC decoding to the EC-encoded data to generate the first-decoded data;

the at least one iterative EC decoder comprises at least one iterative array decoder that applies array decoding in an iterative manner to the first-decoded data to generate the second-decoded data; and the algebraic EC decoder is an algebraic array decoder that applies array decoding in an algebraic manner to the second-decoded data to generate the output decoded data.

17. A method for decoding EC-encoded data generated by (1) applying an outer EC encoder to a first block of data to generate a first block of symbols and (2) applying at least one inner EC encoder to the first block of symbols to generate a first block of codewords, the method comprising:

(a) applying at least one inner EC decoder to decode a second block of codewords corresponding to the first block of codewords, which decoding of the second block of codewords generates a second block of symbols corresponding to the first block of symbols, wherein the inner EC decoder independently decodes each codeword in the second block of codewords, at least one codeword being decoded by the inner EC decoder to generate two or more symbols in the second block of symbols; and (b) applying an algebraic outer EC decoder to the second block of symbols to generate a second block of data corresponding to the first block of data, wherein:

the at least one inner EC decoder comprises a two-dimensional product code (2DPC) decoder; and the algebraic outer EC decoder is an algebraic array decoder.

18. A concatenated decoder for decoding EC-encoded data generated by (1) applying an outer EC encoder to a first block of data to generate a first block of symbols and (2) applying at least one inner EC encoder to the first block of symbols to generate a first block of codewords, the decoder comprising:

at least one inner EC decoder adapted to decode a second block of codewords corresponding to the first block of codewords, which decoding of the second block of codewords generates a second block of symbols corresponding to the first block of symbols, wherein the at least one inner EC decoder independently decodes each codeword in the second block of codewords, at least one codeword being decoded by the inner EC decoder to generate two or more symbols in the second block of symbols; and an algebraic outer EC decoder adapted to apply an algebraic decoding scheme to the second block of symbols to generate a second block of data corresponding to the first block of data, wherein:

the at least one inner EC decoder comprises a 2DPC decoder; and the algebraic outer EC decoder is an algebraic array decoder.

* * * * *